(12) United States Patent
Tak et al.

(10) Patent No.: US 8,138,510 B2
(45) Date of Patent: Mar. 20, 2012

(54) GALLIUM NITRIDE LIGHT EMITTING DEVICES AND METHODS OF MANUFACTURING THE SAME

(75) Inventors: Young-jo Tak, Hwaseong-si (KR); Jun-youn Kim, Hwaseong-si (KR); Hyun-gi Hong, Suwon-si (KR); Jae-won Lee, Suwon-si (KR); Hyung-su Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/662,925

(22) Filed: May 12, 2010

(65) Prior Publication Data

US 2011/0121330 A1    May 26, 2011

(30) Foreign Application Priority Data

Nov. 23, 2009   (KR) .................. 10-2009-0113359

(51) Int. Cl.
*H01L 33/00*   (2010.01)
*H01L 33/20*   (2010.01)
*H01L 33/24*   (2010.01)

(52) U.S. Cl. ........... 257/94; 257/E33.067; 257/E33.005; 257/E33.023

(58) Field of Classification Search .................... 257/98, 257/94, E33.025
See application file for complete search history.

(56) References Cited

U.S. PATENT DOCUMENTS

| | | | | |
|---|---|---|---|---|
| 6,495,862 | B1 * | 12/2002 | Okazaki et al. | 257/103 |
| 7,535,028 | B2 * | 5/2009 | Fan et al. | 257/88 |
| 7,863,637 | B2 * | 1/2011 | Nago et al. | 257/98 |
| 2009/0272971 | A1 * | 11/2009 | Lee et al. | 257/43 |

FOREIGN PATENT DOCUMENTS

| | | |
|---|---|---|
| KR | 10-2005-0070854 | 7/2005 |
| KR | 10-0638609 | 10/2006 |
| KR | 10-0863804 | 10/2008 |

* cited by examiner

*Primary Examiner* — Keisha Bryant
*Assistant Examiner* — Neil Prasad
(74) *Attorney, Agent, or Firm* — Harness, Dickey & Pierce, P.L.C.

(57) ABSTRACT

A gallium nitride (GaN) light emitting device and a method of manufacturing the same are provided, the method including sequentially forming a buffer layer and a first nitride layer on a silicon substrate, and forming a plurality of patterns by dry etching the first nitride layer. Each pattern includes a pair of sidewalls facing each other. A reflective layer is deposited on the first nitride layer so that one sidewall of the pair is exposed by the reflective layer. An n-type nitride layer that covers the first nitride layer is formed by horizontally growing an n-type nitride from the exposed sidewall, and a GaN-based light emitting structure layer is formed on the n-type nitride layer.

45 Claims, 11 Drawing Sheets

GALLIUM NITRIDE LIGHT EMITTING DEVICES AND METHODS OF MANUFACTURING THE SAME

CROSS-REFERENCE TO RELATED APPLICATIONS

This application claims the benefit of priority under 35 U.S.C. §119 from Korean Patent Application No. 10-2009-0113359, filed on Nov. 23, 2009, in the Korean Intellectual Property Office, the disclosure of which is incorporated herein in its entirety by reference.

BACKGROUND

1. Field

Example embodiments relate to gallium nitride (GaN) light emitting devices and methods of manufacturing the same. Other example embodiments relate to GaN-based light emitting devices on a silicon substrate and methods of manufacturing the same.

2. Description of the Related Art

Gallium nitride (GaN) and GaN-based nitride are widely used to form various electronic devices (e.g., power devices, light emitting devices or similar devices).

A GaN substrate is preferable for epitaxial growth of GaN-based material thereon. However, the GaN substrate is not appropriate when crystallinity, large-scale production and/or manufacturing costs are taken into consideration. A silicon carbide (SiC) substrate, or a sapphire substrate, is used to perform epitaxial growth of a GaN-based nitride. However, the SiC substrate is expensive, and the sapphire substrate may be bent due to low thermal conductivity when a semiconductor layer having a large diameter is grown on the sapphire substrate.

A silicon substrate is widely used for a GaN-based light emitting device. The silicon substrate is cheaper than the sapphire substrate or the SiC substrate. A silicon wafer having a large diameter of about 12" may be used. Also, the silicon substrate has an electrical conductivity. As such, electrodes may be disposed on a lower surface of the silicon substrate. Thus, a process of manufacturing GaN devices may be easily performed. In addition, the silicon substrate has higher thermal conductivity than the thermal conductivity of the sapphire substrate. Thus, the silicon substrate is not easily bent when a GaN thin film is grown even at a high temperature.

However, due to a difference in lattice constants and in the thermal expansion coefficients between the silicon substrate and the GaN thin film, a dislocation density in the GaN thin film may increase and subsequently cracks may occur in the GaN thin film. In addition, the silicon substrate absorbs light generated in a light emitting layer. As such, an external quantum efficiency of the light emitting device is lowered.

SUMMARY

Example embodiments relate to gallium nitride (GaN) light emitting devices and methods of manufacturing the same.

Gallium nitride (GaN)-based light emitting devices including a silicon substrate and methods of manufacturing the same are provided.

Additional aspects will be set forth in part in the description which follows and, in part, will be apparent from the description, or may be learned by practice of the example embodiments.

According to example embodiments, there is provided a method of manufacturing a gallium nitride (GaN) light emitting device, the method including sequentially forming a buffer layer and a first nitride layer on a silicon substrate, forming a plurality of patterns each having facing sidewalls. The plurality of patterns may be formed by dry etching the first nitride layer. A reflective layer is deposited on the first nitride layer so that one of the facing sidewalls is exposed by the reflective layer. An n-type nitride layer for covering the first nitride layer is formed by horizontally growing an n-type nitride from the exposed sidewall. A GaN-based light emitting structure layer is formed on the n-type nitride layer.

Formation of the plurality of patterns may include forming a pattern having a shape selected from the group consisting of striped, rectangular, hexagonal and circular.

Deposition of the reflective layer may include irradiating beams formed of a reflective material in a set inclined angle with respect to the first nitride layer by using physical vapor deposition (PVD) having linearity.

The reflective layer may be formed to a thickness of about 0.01-μm to about 2-μm.

The reflective layer may be formed by alternately stacking a plurality of dielectric layers having different refractive indexes, or by forming a metal layer.

The buffer layer may include at least one of the group consisting of $In_xGa_yAl_zN$ (wherein $0 \leq x \leq 1$, $0 \leq y \leq 1$, $0 \leq z \leq 1$, $x+y+z=1$), zirconium diboride ($ZrB_2$), hafnium diboride ($HfB_2$), zirconium nitride (ZrN), hafnium nitride (HfN), titanium nitride (TiN), aluminum nitride (AlN) and combinations thereof.

Formation of the GaN-based light emitting structure layer on the n-type nitride layer may include forming an active layer, a p-type nitride layer and a transparent electrode layer on the n-type nitride layer. A p-type electrode is formed on the transparent electrode layer, and an n-type electrode is formed on a bottom surface of the silicon substrate. The buffer layer and the first nitride layer have a conductivity.

Formation of the GaN-based light emitting structure layer on the n-type nitride layer may include forming an active layer, a p-type nitride layer and a transparent electrode layer on the n-type nitride layer, sequentially etching the transparent electrode layer, the active layer, the p-type nitride layer and an upper portion of the n-type nitride layer, wherein the transparent electrode layer, the active layer, and the p-type nitride layer are formed in a first region of the n-type nitride. A p-type electrode is formed on the transparent electrode layer, and an n-type electrode is formed on an upper surface of the n-type nitride layer in the first region of the n-type nitride.

According to example embodiments, there is provided a method of a gallium nitride (GaN) light emitting device, the method including forming a plurality of patterns each having facing sidewalls. The plurality of patterns may be formed by patterning a silicon substrate. The method includes depositing a reflective layer on the silicon substrate so that one of the facing sidewalls is exposed from the reflective layer, forming a buffer layer on the exposed sidewall, forming an n-type nitride layer for covering the silicon substrate by horizontally growing an n-type nitride from the buffer layer, and forming a GaN-based light emitting structure layer on the n-type nitride layer.

According to example embodiments, there is provided a method of a gallium nitride (GaN) light emitting device, the method including forming a plurality of patterns each having facing sidewalls. The plurality of patterns may be formed by patterning a silicon substrate. The method includes forming a buffer layer on the patterns, depositing a reflective layer on the buffer layer by using deposition so that one of the facing sidewalls is exposed from the reflective layer, forming an n-type nitride layer for covering the silicon substrate by horizontally growing an n-type nitride from the exposed side wall, and forming a GaN-based light emitting structure layer on the n-type nitride layer.

According to example embodiments, there is provided a gallium nitride (GaN) light emitting device including a silicon substrate, a buffer layer on the silicon substrate, and a first nitride layer on the buffer layer. The GaN light emitting device includes a plurality of patterns each having facing sidewalls, a reflective layer on the first nitride layer wherein one of the facing sidewalls is exposed by the reflective layer, an n-type nitride layer on the reflective layer for covering the exposed sidewall, and a GaN-based light emitting structure layer on the n-type nitride layer.

According to example embodiments, there is provided a gallium nitride (GaN) light emitting device including a silicon substrate having a plurality of patterns each including facing sidewalls on the silicon substrate, a reflective layer on the silicon substrate wherein one of the facing sidewalls is exposed by the reflective layer, a buffer layer on the exposed sidewall, an n-type nitride layer on the reflective layer for covering the exposed side wall, and a GaN-based light emitting structure layer formed on the n-type nitride layer.

According to example embodiments, there is provided a gallium nitride (GaN) light emitting device including a silicon substrate having a plurality of patterns each including facing sidewalls on the silicon substrate, a buffer layer on the silicon substrate, a reflective layer on the buffer layer wherein one of the facing sidewalls is exposed by the reflective layer, an n-type nitride layer on the reflective layer for covering the exposed side wall, and a GaN-based light emitting structure layer formed on the n-type nitride layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to gallium nitride (GaN) light emitting devices and methods of manufacturing the same. Other example embodiments relate to GaN-based light emitting devices on a silicon substrate and methods of manufacturing the same.

FIGS. 1A through 1H are cross-sectional views illustrating a method of manufacturing a horizontal gallium nitride (GaN) light emitting device according to example embodiments.

Figure 1A:
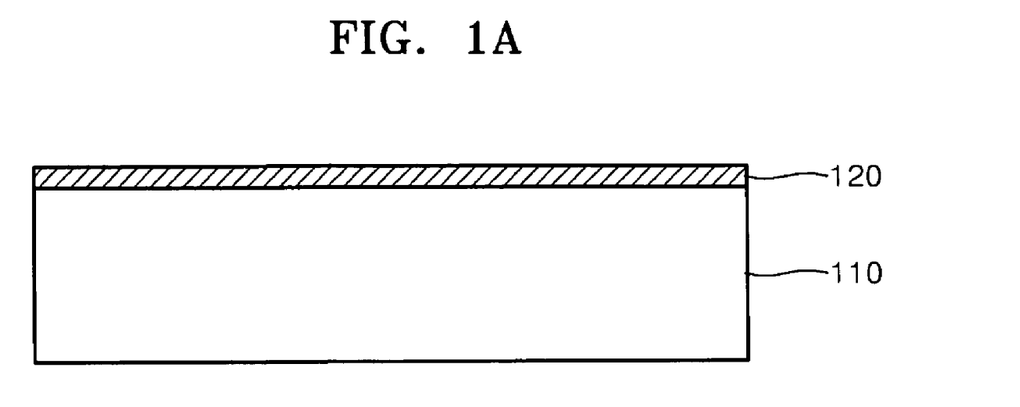
FIGS. 1A through 1H are cross-sectional views illustrating a method of manufacturing a horizontal gallium nitride (GaN) light emitting device according to example embodiments.

Referring to FIG. 1A, a buffer layer 120 is grown on a silicon substrate 110. The buffer layer 120 may be formed of at least one of the group consisting of $In_xGa_yAl_zN$ (wherein $0 \leq x \leq 1$, $0 \leq y \leq 1$, $0 \leq z \leq 1$, $x+y+z=1$), zirconium diboride ($ZrB_2$), hafnium diboride ($HfB_2$), zirconium nitride (ZrN), hafnium nitride (HfN), titanium nitride (TiN), aluminum nitride (AlN) and combinations thereof. The buffer layer 120 may be formed to a thickness of about 5-nm to about 1000-nm. The buffer layer 120 prevents a high-temperature reaction between a material to be formed on the buffer layer 120 and the silicon substrate 110.

Figure 1B:
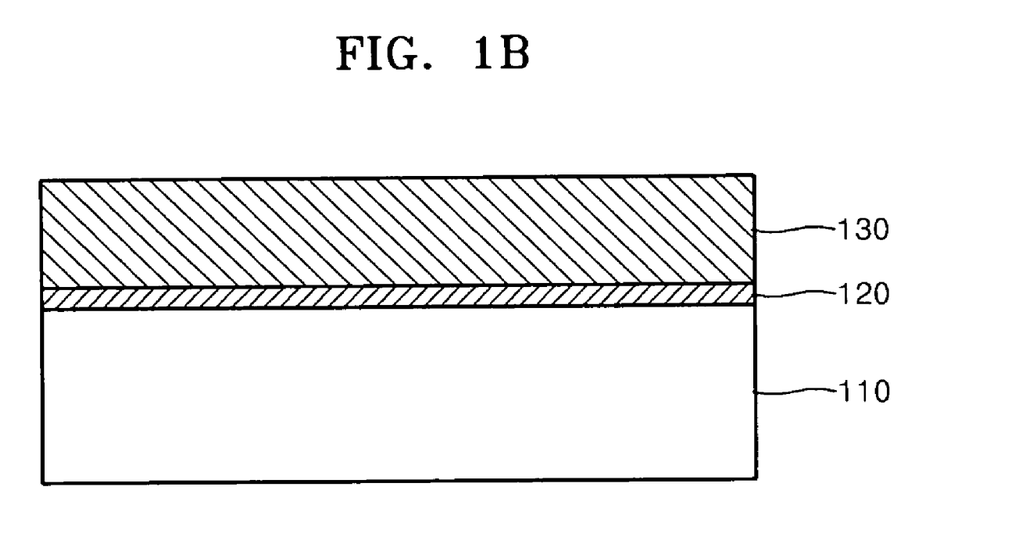

Referring to FIG. 1B, a first nitride layer 130 is formed on the buffer layer 120. The first nitride layer 130 may be formed of $In_xGa_yAl_zN$ (wherein $0 \leq x \leq 1$, $0 \leq y \leq 1$, $0 \leq z \leq 1$, $x+y+z=1$). The first nitride layer 130 may have a single layer structure including only one composition, or a multiple layer structure having various compositions. For example, when the buffer layer 120 is formed of AlN, the first nitride layer 130 may have a multiple layer structure including, for example, compositions of $Al_{0.75}Ga_{0.25}N$, $Al_{0.5}Ga_{0.5}N$, $Al_{0.25}Ga_{0.75}N$ and GaN in this order. As such, lattice mismatch between the buffer layer 120 and the first nitride layer 130 may be reduced, and the density of threading dislocation may be efficiently controlled. The thickness of the first nitride layer 130 may be about 0.01-μm to about 10-μm.

Figure 1C:
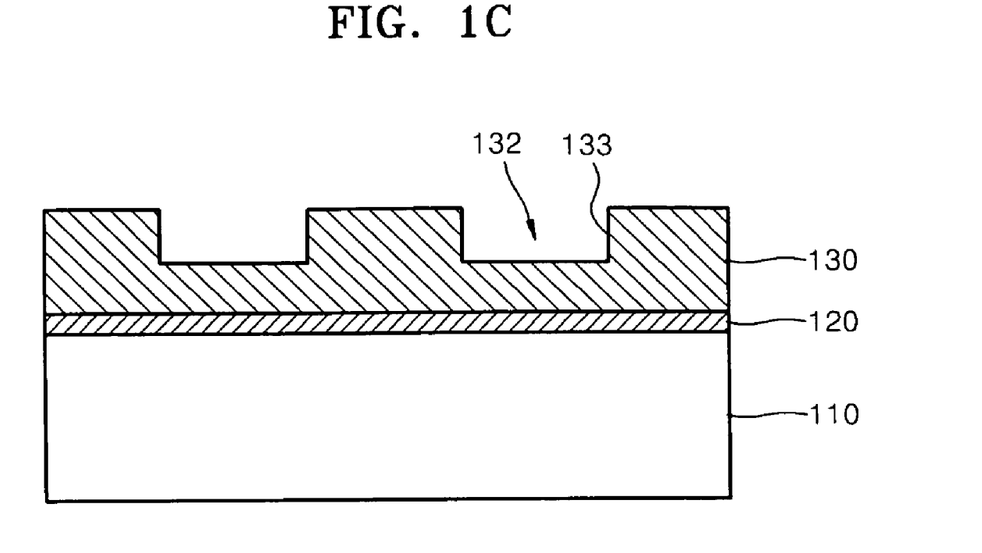

Referring to FIG. 1C, a plurality of patterns 132 are formed by etching the first nitride layer 130. Each of the patterns 132 is formed to have a sidewall 133 by using dry etching process (e.g., reactive ion etching (RIE) or a similar process). The pattern 132 may have a striped shape, a rectangular shape, a hexagonal shape or a circular shape. The size (the length or diameter of the smallest side) of the pattern 132 may be about 0.01-μm to about 500-μm. A distance between the patterns 132 may be about 0.01-μm to about 500-μm. The pattern 132 may be formed by etching a portion, or the whole (or entire), height of the first nitride layer 130. The pattern 132 may have a depth of about 0.1-μm to about 10-μm. In FIG. 1, for example, the pattern 132 is formed to have the shape of a groove in which only portions of the surface of the first nitride layer 130 are etched.

Figure 1D:
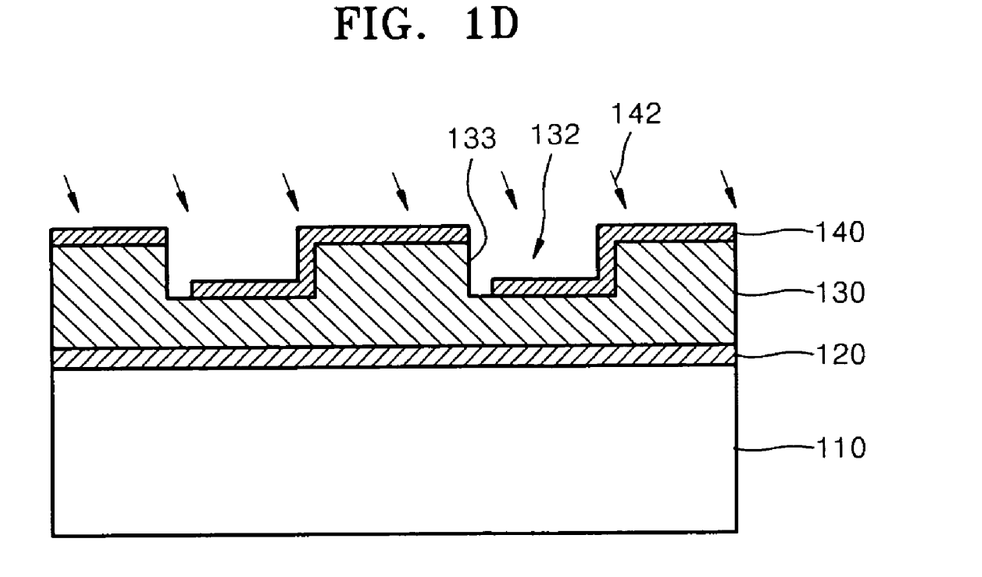

Referring to FIG. 1D, a reflective layer 140 is formed on the first nitride layer 130. The reflective layer 140 is formed using physical vapor deposition (PVD) having linearity (e.g., evaporation, sputtering or a similar technique). Beams 142 formed of material deposited on the first nitride layer 130 form a set angle to the substrate 110. Thus, the pattern 132 may include portions in which the reflective layer 140 is not formed. The reflective layer 140 may be formed to a thickness of about 0.01-μm to about 2-μm.

A structure in which dielectric materials having different refractive indexes are alternately stacked (e.g., $SiO_2/TiO_2$, $SiO_2/SiC$, $SiO_2/SiN_x$ or similar arrangements) may be used to form the reflective layer 140. The reflective layer 140 may be formed of a metal having a substantially high reflectivity (e.g., silver (Ag), aluminum (Al), gold (Au) or the like). The reflective layer 140 may also be formed by mixing a dielectric material and a reflective metal. In other words, the reflective layer 140 may have a structure in which a dielectric layer and a metal layer are alternately stacked (e.g., $SiO_2/Ag/SiO_2$).

Figure 1E:
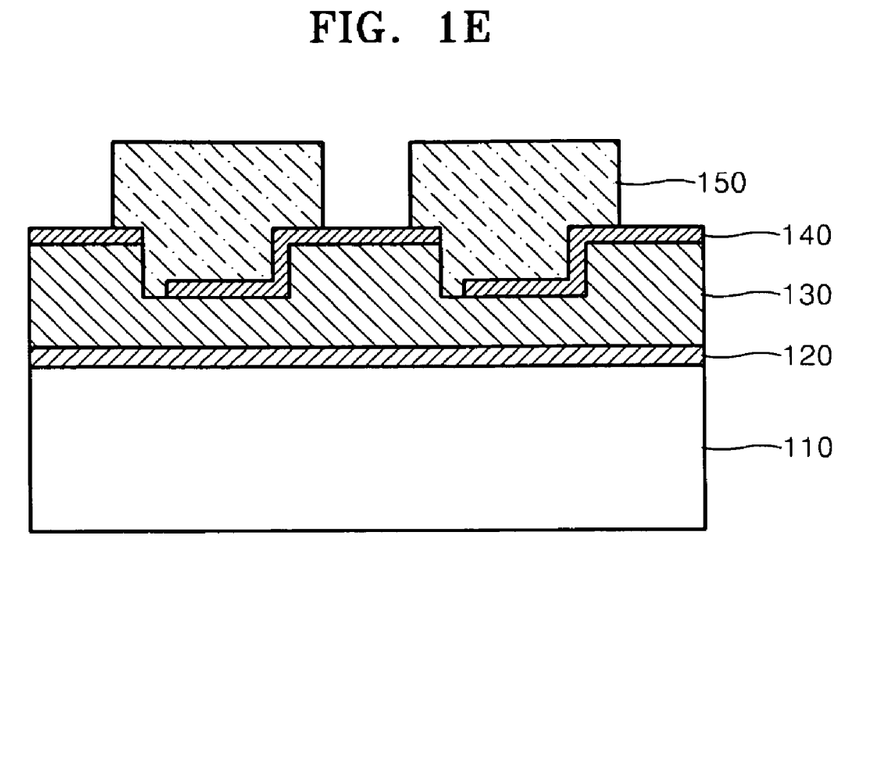

Referring to FIG. 1E, a second nitride layer 150 is laterally and epitaxially grown from the first nitride layer 130 exposed by the reflective layer 140. Although a portion of a bottom surface of the pattern 132 is not covered by the reflective layer 140, material to be deposited on the pattern 132 primarily contacts the sidewalls 133 of the pattern 132. As such, lateral growth mainly occurs in the pattern 132. Because the lateral growth is performed in the pattern 132 in one direction, vertical dislocation does not occur in the pattern 132. In detail, when the pattern 132 is not covered by the reflective layer 140, vertical dislocation may occur where two nitride layers contact each other in a region of the pattern 132 when the two nitride layers are simultaneously grown from both facing sides inside the pattern 132. However, according to example embodiments, the occurrence of vertical dislocation inside the pattern is prevented. Also, due to this lateral growth, threading dislocation is remarkably reduced.

The second nitride layer 150 may be formed of $In_xGa_yAl_zN$ (wherein $0 \leq x \leq 1$, $0 \leq y \leq 1$, $0 \leq z \leq 1$, $x+y+z=1$) and grown using metal organic chemical vapor deposition (MOCVD). In this case, a silicon dopant is added to the second nitride layer 150 so that the second nitride layer 150 may have n-type conductivity. The second nitride layer 150 becomes an n-type nitride layer.

Figure 1F:
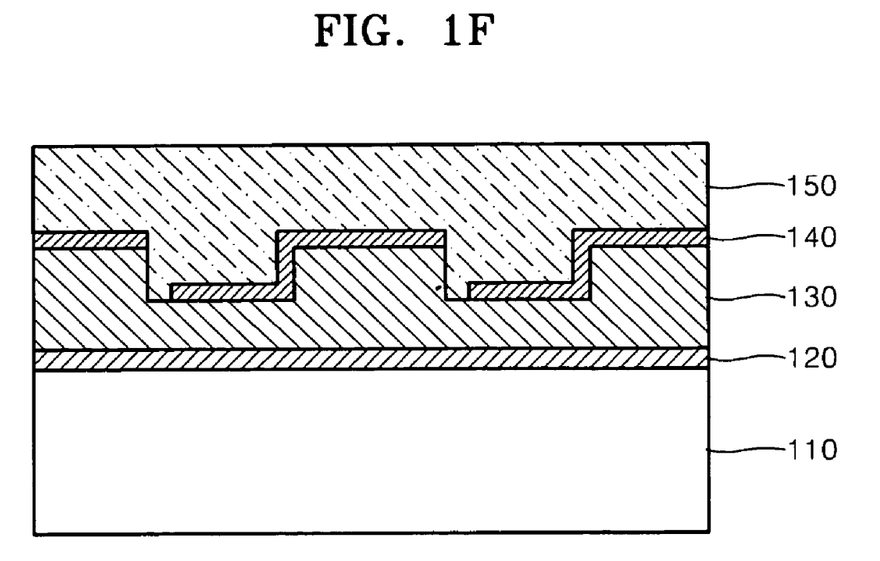

Referring to FIG. 1F, the grown second nitride layers 150 are combined with each other.

Figure 1G:
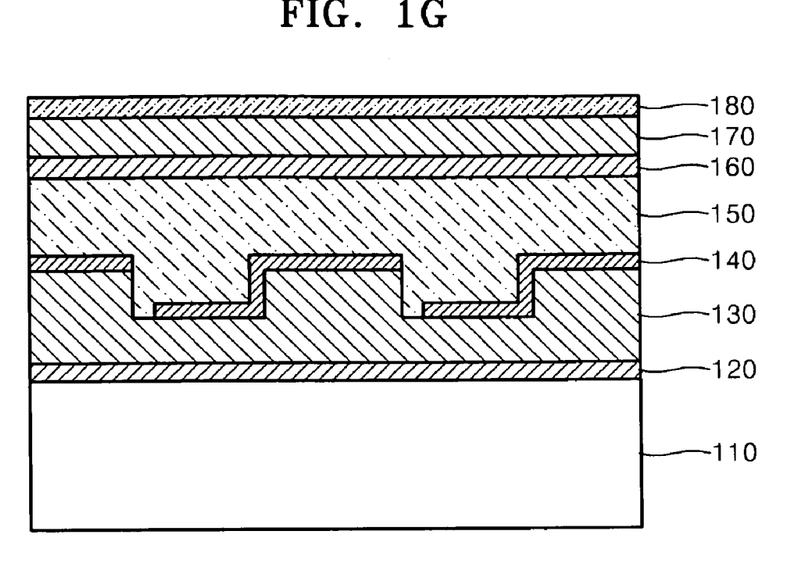

Referring to FIG. 1G, a multiple quantum well (MQW) active layer 160 and a p-type nitride layer 170 are sequentially formed on the second nitride layer 150. A transparent electrode layer 180 is formed on the p-type nitride layer 170. The transparent electrode layer 180 may be formed of at least one of the group consisting of Ni/Au, ITO, ZnO and combinations thereof.

Figure 1H:
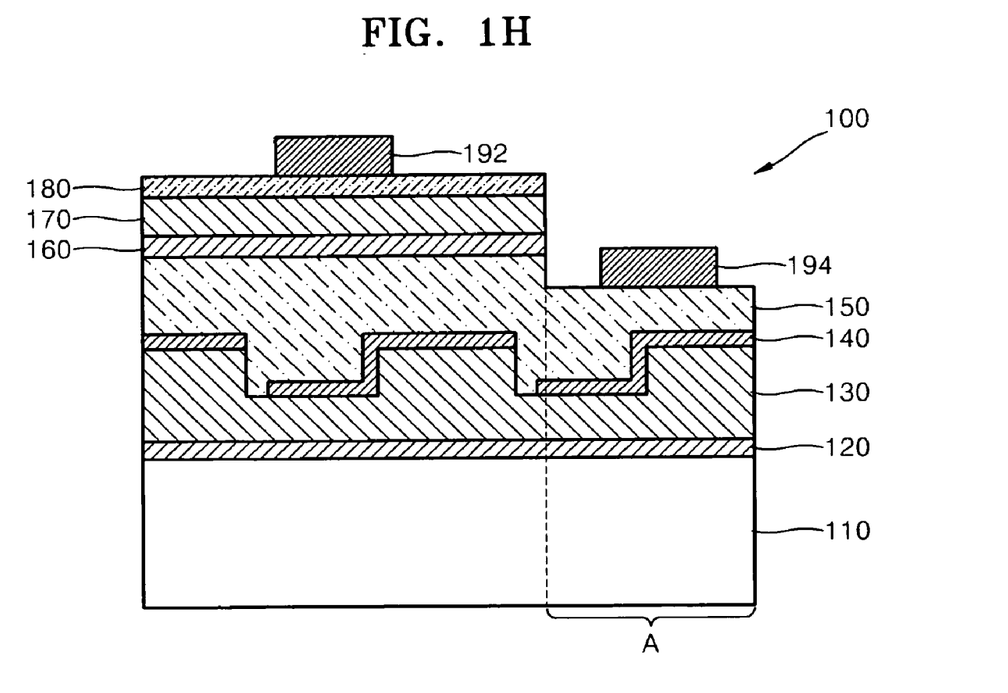

Referring to FIG. 1H, the transparent electrode layer 180, the p-type nitride layer 170, the MQW active layer 160 and the second nitride layer 150 are sequentially etched by performing a mesa process in order to expose a portion A of the second nitride layer 150. Subsequently, a p-type electrode 192 is formed on the transparent electrode layer 180, and an n-type electrode 194 is formed on the exposed second nitride layer 150.

In the horizontal GaN light emitting device 100 that is manufactured by the method of FIGS. 1A through 1H, a significant portion of the silicon substrate 110 is blocked by the reflective layer 140. As such, the absorption of light on the silicon substrate 110 is prevented and an optical extraction efficiency may increase. Because the n-type nitride layer is horizontally grown in one direction, threading dislocation, and optical loss due to defect density, may be reduced.

Figure 2:
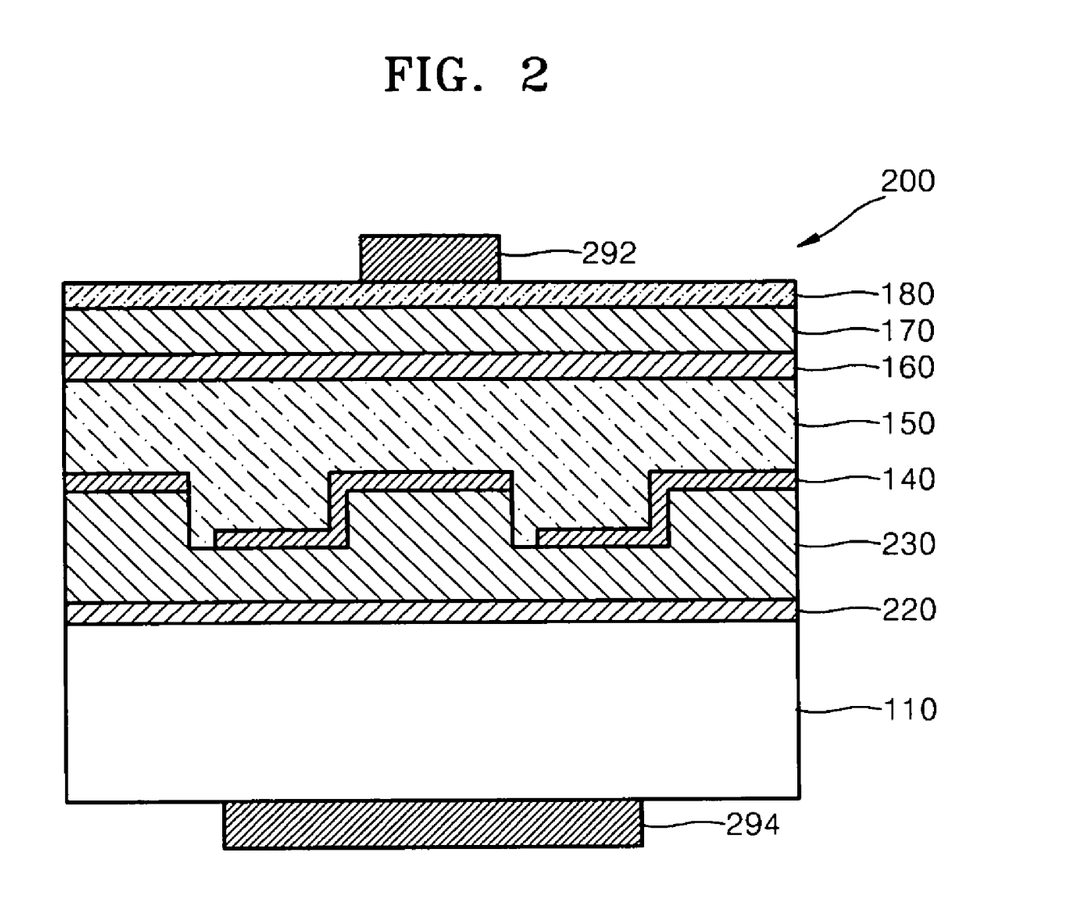
FIG. 2 is a cross-sectional view of a structure of a vertical GaN light emitting device according to example embodiments.

FIG. 2 is a cross-sectional view of a structure of a vertical GaN light emitting device according to example embodiments.

Elements that are substantially the same as those of FIGS. 1A through 1H represent same reference numerals, and thus a detailed description thereof will not be provided here for the sake of brevity.

Referring to FIG. 2, in the vertical GaN light emitting device 200 according to example embodiments, an n-type electrode 294 is formed on a bottom surface of a silicon substrate 110. A buffer layer 220 may be formed to have conductivity by doping a material (e.g., silicon (Si)) into $In_xGa_yAl_zN$ ($0 \leq x \leq 1$, $0 \leq y \leq 1$, $0 \leq z \leq 1$, $x+y+z=1$).

The buffer layer 220 may be formed of a conductive material (e.g., $ZrB_2$, $HfB_2$, $ZrN$, $HfN$, $TiN$, combinations thereof or the like).

A first nitride layer 230 may be formed to have n-type conductivity by doping a material (e.g., silicon (Si)) into the first nitride layer 230.

The method of FIGS. 1A through 1G may be used for the vertical GaN light emitting device 200. The difference is that the buffer layer 220 and the first nitride layer 230 are formed to have conductivity, as described above. Subsequently, a p-type electrode 292 and an n-type electrode 294 are respectively formed on upper and lower surfaces of a resultant structure of FIG. 1G so that the vertical GaN light emitting device 200 may be manufactured.

As a conductive silicon substrate is used, the vertical GaN light emitting device 200 may be manufactured, and thus the method of manufacturing the same may be easily performed.

FIGS. 3A through 3G are cross-sectional views of illustrating a method of manufacturing a horizontal GaN light emitting device according to example embodiment.

Figure 3A:
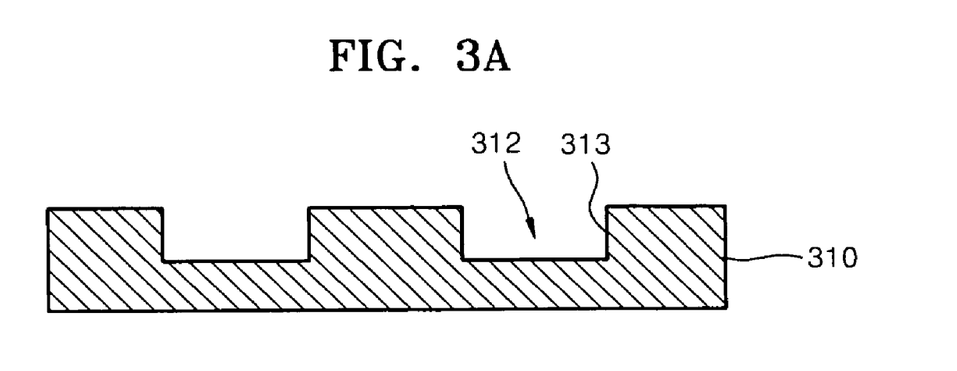
FIGS. 3A through 3G are cross-sectional views of illustrating a method of manufacturing a horizontal GaN light emitting device according to example embodiments.

Referring to FIG. 3A, a plurality of patterns 312 are formed by etching a silicon substrate 310. In this case, wet etching using an etchant (e.g., tetramethylammonium hydroxide (TMAH) or potassium hydroxide (KOH)) or dry etching (e.g., reactive ion etching (RIE)) may be used. After dry etching is performed, wet etching may be subsequently performed. Crystalline surfaces and angles of a side surface of the silicon substrate 310 that are exposed through etching may vary according to a crystalline surface of the silicon substrate 310, an etching method and the shape of the patterns 312. For example, when wet etching is used, a pattern structure including a Si (110) or Si (100) substrate having a Si (111) or Si (001) side surface may be obtained.

Each of the patterns 312 may have at least one shape selected from the group consisting of striped, rectangular, hexagonal and circular. The size (the length or diameter of the smallest side) of the pattern 312 may be about 0.01-μm to about 500-μm. A distance between the patterns 132 may be about 0.01-μm to about 500-μm. The pattern 312 may be formed by etching portions of the silicon substrate 310. The patterns 312 may have a depth of about 0.1-μm to about 10-μm.

Figure 3B:
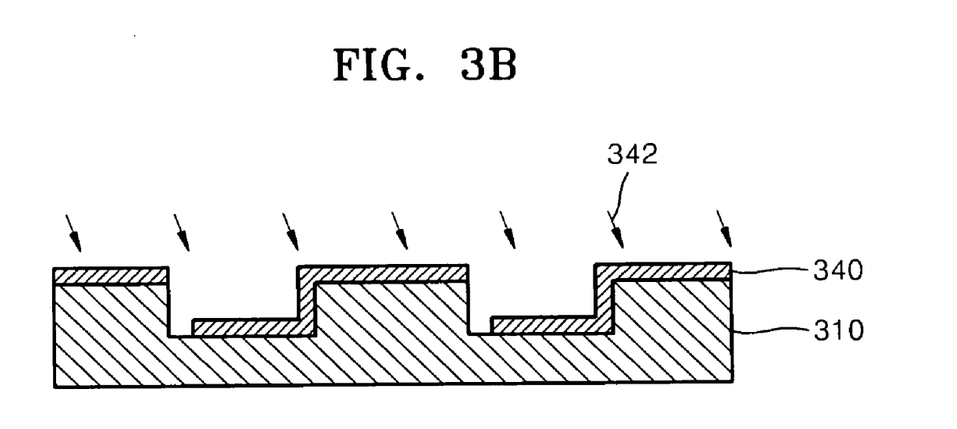

Referring to FIG. 3B, a reflective layer 340 is formed on the patterned silicon substrate 310. The reflective layer 340 is formed using PVD having linearity (e.g., evaporation, sputtering or a similar technique). Beams 342 formed of material deposited on the patterned silicon substrate 310 are irradiated on the substrate 310 in a set angle to the substrate 310. Thus, the pattern 312 may include a portion in which the reflective layer 340 is not formed. The reflective layer 340 may be formed to a thickness of about 0.01-μm to about 2-μm.

A structure in which dielectric substances having different refractive indexes are alternately stacked (e.g., $SiO_2/TiO_2$, $SiO_2/SiC$, $SiO_2/SiN_x$, combinations thereof or the like) may be used to form the reflective layer 340. The reflective layer 340 may be formed of a metal having a substantially high reflectivity (e.g., silver (Ag), aluminum (Al), gold (Au) or the like). The reflective layer 340 may also be formed by mixing a dielectric substance and a reflective metal. In other words, the reflective layer 340 may have a structure in which a dielectric layer and a metal layer are alternately stacked (e.g., $SiO_2/Ag/SiO_2$).

Figure 3C:
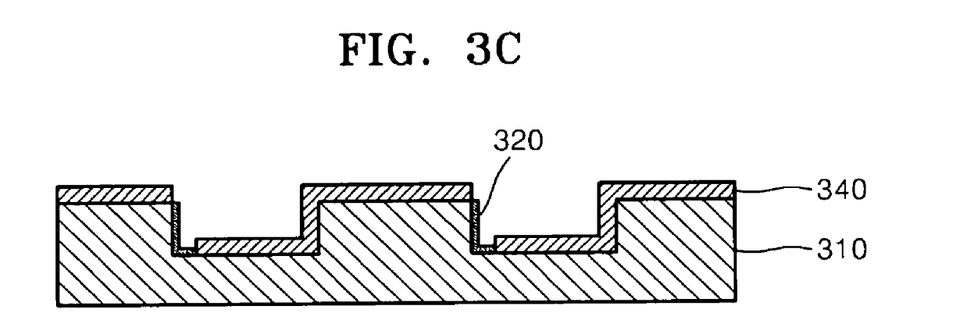

Referring to FIG. 3C, a buffer layer 320 is formed on the portion in which the reflective layer 340 is not formed. The buffer layer 320 may be formed of $In_xGa_yAl_zN$ (wherein $0 \leq x \leq 1$, $0 \leq y \leq 1$, $0 \leq z \leq 1$, $x+y+z=1$) or AlN. The buffer layer 320 may have a thickness of about 5-nm to about 1000-nm. The buffer layer 320 may be formed using MOCVD.

Figure 3D:
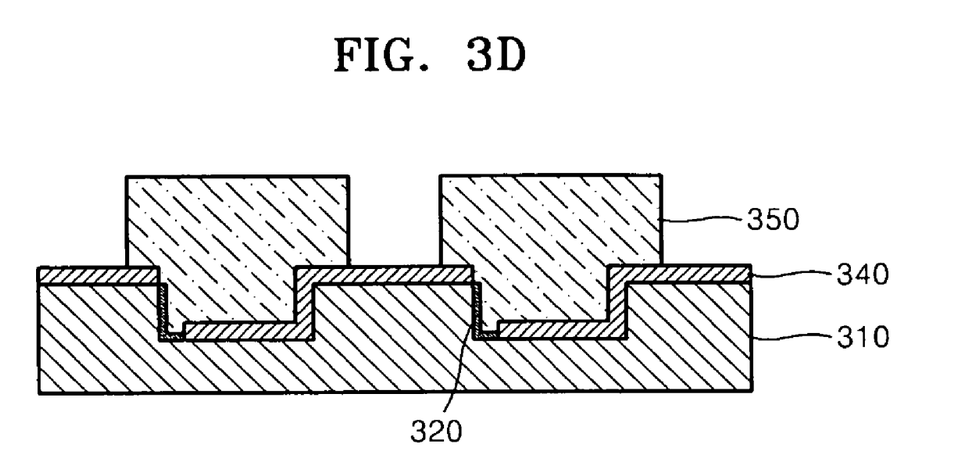

Referring to FIG. 3D, an n-type nitride layer 350 is laterally and epitaxially grown from the buffer layer 320. The n-type nitride layers 350 that are formed of $In_xGa_yAl_zN$ (wherein $0 \leq x \leq 1$, $0 \leq y \leq 1$, $0 \leq z \leq 1$, $x+y+z=1$) may be grown using MOCVD. In this case, a silicon dopant is added to the n-type nitride layer 350 so that the n-type nitride layer 350 may have n-type conductivity.

Figure 3E:
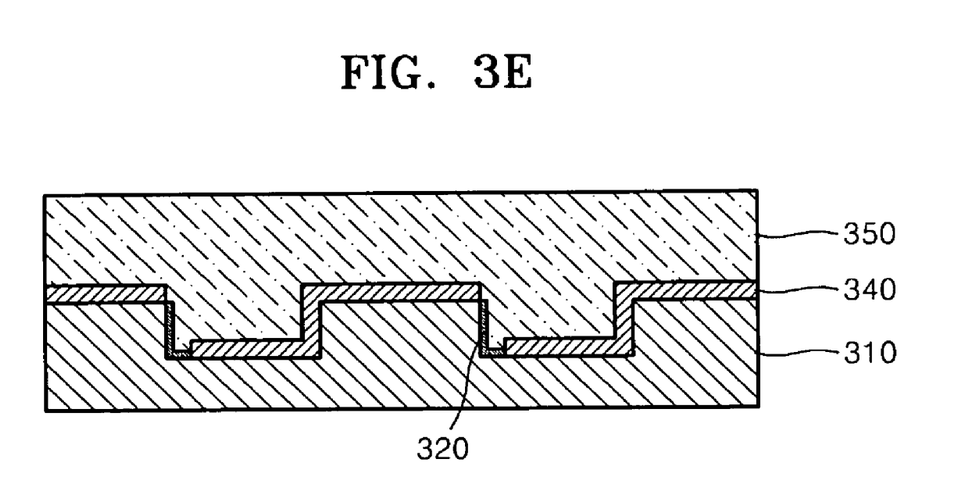

Referring to FIG. 3E, the grown n-type nitride layers 350 are combined with each other.

Figure 3F:
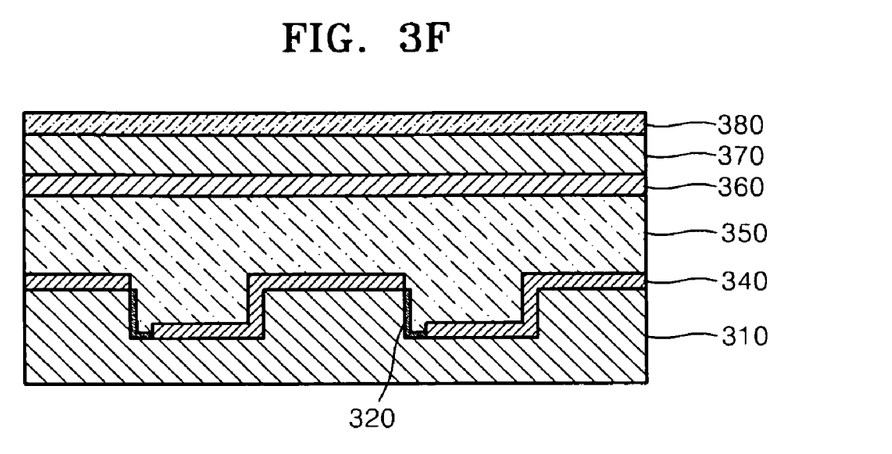

Referring to FIG. 3F, a MQW active layer 360 and a p-type nitride layer 370 are sequentially formed on the n-type nitride layer 350. A transparent electrode layer 380 is formed on the p-type nitride layer 730. The transparent electrode layer 380 may be formed of at least one of the group consisting of Ni/Au, ITO, ZnO and combinations thereof.

Figure 3G:
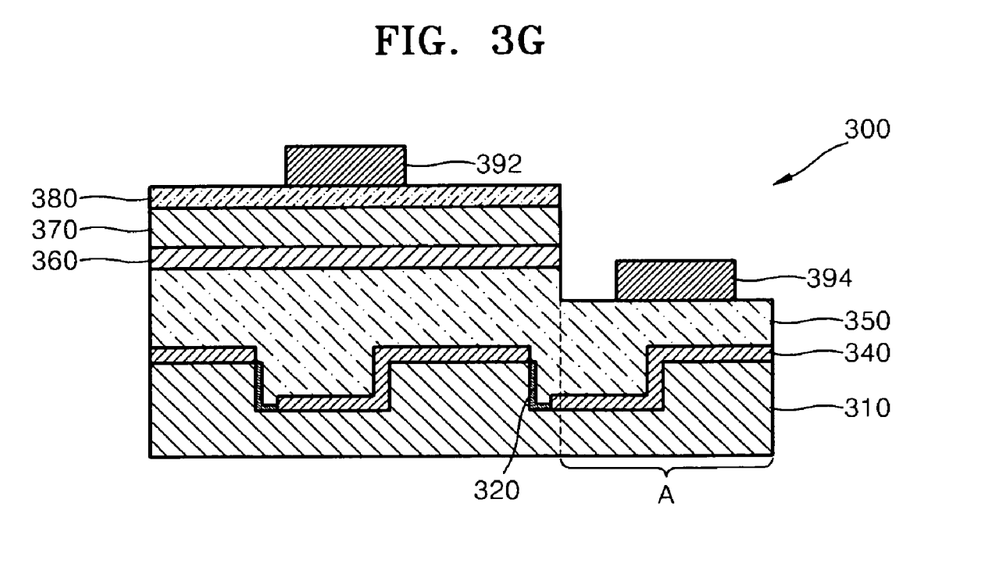

Referring to FIG. 3G, the transparent electrode layer 380, the p-type nitride layer 370, the MQW active layer 360 and the n-type nitride layer 350 are sequentially etched by performing a mesa process in order to expose a portion A of the n-type nitride layer 350. Subsequently, a p-type electrode 392 is formed on the transparent electrode layer 380, and an n-type electrode 394 is formed on the exposed n-type nitride layer 350.

In the horizontal GaN light emitting device 300 that is manufactured by the method of FIGS. 3A through 3G, a significant portion of the silicon substrate 310 is blocked by the reflective layer 340. Light generated in the MQW active layer 360 is not absorbed by the silicon substrate 310 but is reflected from the reflective layer 340 and is emitted to the outside so that optical extraction efficiency may increase. Because the n-type nitride layer is horizontally grown in one direction, threading dislocation, and optical loss due to defect density, may be reduced. Also, a region of the n-type nitride layer 350 in which the n-type nitride layer 350 contacts the silicon substrate 310 is small, and thus cracks due to a difference between thermal expansion coefficients between the n-type nitride layer 350 and the silicon substrate 310 may be reduced.

Figure 4:
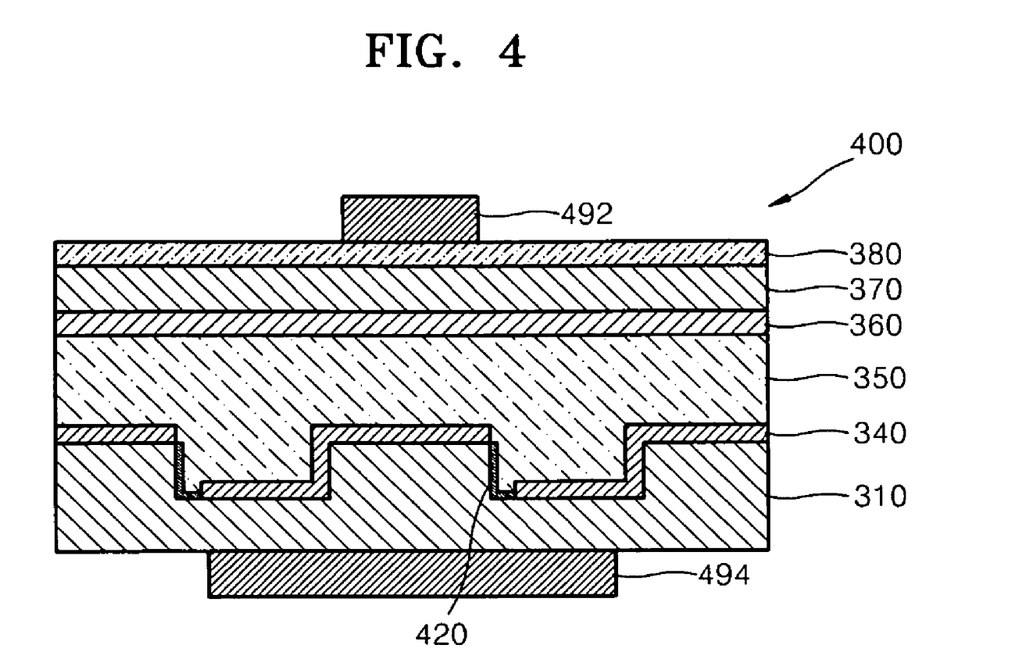
FIG. 4 is a cross-sectional view of a structure of a vertical GaN light emitting device according to example embodiments.

FIG. 4 is a cross-sectional view of a structure of a vertical GaN light emitting device according to example embodiments.

Elements that are substantially the same as those of FIGS. 3A through 3G represent same reference numerals, and thus a detailed description thereof will not be provided here for the sake of brevity.

Referring to FIG. 4, in the vertical GaN light emitting device 400 according to example embodiments, an n-type electrode 494 is formed on a bottom surface of a silicon substrate 410. A buffer layer 420 may be formed to have conductivity by doping a material (e.g., silicon (Si)) into $In_xGa_yAl_zN$ (wherein $0≦x≦1$, $0≦y≦1$, $0≦z≦1$, $x+y+z=1$).

The buffer layer 420 may be formed of a conductive material (e.g., $ZrB_2$, $HfB_2$, ZrN, HfN, TiN, combinations thereof or the like).

An n-type nitride layer 530 may be formed to have n-type conductivity by doping a material (e.g., Si) into the n-type nitride layer 530.

The method of FIGS. 3A through 3F may be used for the vertical GaN light emitting device 400. The difference is that the buffer layer 420 and the n-type nitride layer 530 are formed to have conductivity, as described above. Subsequently, a p-type electrode 492 and an n-type electrode 494 are respectively formed on upper and lower surfaces of a resultant structure of FIG. 3F so that the vertical GaN light emitting device 400 may be manufactured.

FIGS. 5A through 5D are cross-sectional views of illustrating a method of manufacturing a horizontal GaN light emitting device according to example embodiments.

Figure 5A:
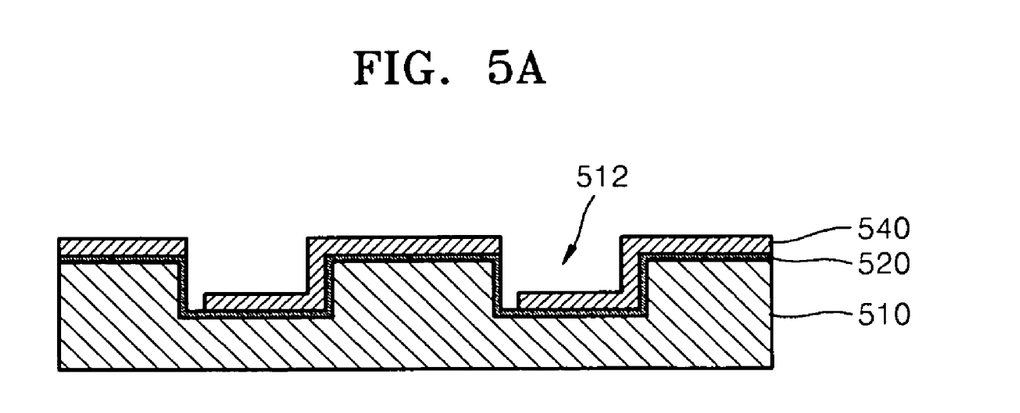
FIGS. 5A through 5D are cross-sectional views of illustrating a method of manufacturing a horizontal GaN light emitting device according to example embodiments.

Referring to FIG. 5A, a plurality of patterns 512 are formed by etching a silicon substrate 510. In this case, wet etching using an etchant (e.g., TMAH or KOH) or dry etching (e.g., RIE) may be used. After dry etching is performed, wet etching may be subsequently performed. Crystalline surfaces and angles of a side surface of the silicon substrate 510 that are exposed through etching may vary according to a crystalline surface of the silicon substrate 510, an etching method and the shape of the patterns 512. For example, when wet etching is used, a pattern structure including a Si (110) or Si (100) substrate having a Si (111) or Si (001) side surface may be obtained.

A buffer layer 520 is formed on the patterned silicon substrate 510. The buffer layer 520 may be formed of $In_xGa_yAl_zN$ (wherein $0≦x≦1$, $0≦y≦1$, $0≦z≦1$, $x+y+z=1$) or AlN. The buffer layer 520 may have a thickness of about 5-nm to about 1000-nm. The buffer layer 520 may be formed using MOCVD.

A reflective layer 540 is formed on the buffer layer 520. The reflective layer 540 is formed using PVD having linearity (e.g., evaporation, sputtering or a similar technique). Beams (refer to 142 in FIG. 1D) formed of material deposited on the buffer layer 520 are irradiated to form a set angle to the substrate 510. Thus, the buffer layer 520 may include portions in which the reflective layer 540 is not formed. The reflective layer 540 may be formed to a thickness of about 0.01-μm to about 2-μm.

A structure in which dielectric substances having different refractive indexes are alternately stacked (e.g., $SiO_2/TiO_2$, $SiO_2/SiC$, $SiO_2/SiN_x$, combinations thereof or the like) may be used to form the reflective layer 540. The reflective layer 540 may be formed of a metal having a substantially high reflectivity (e.g., silver (Ag), aluminum (Al), gold (Au) or the like). The reflective layer 540 may also be formed by mixing a dielectric substance and a reflective metal layer. In other words, the reflective layer 540 may have a structure in which a dielectric layer and a metal layer are alternately stacked (e.g., $SiO_2/Ag/SiO_2$).

Figure 5B:
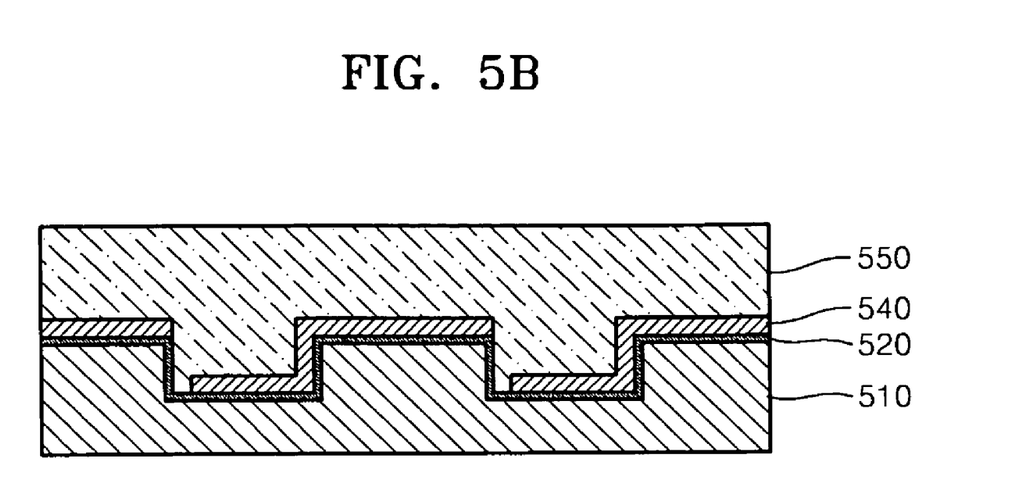

Referring to FIG. 5B, an n-type nitride layer 550 is laterally and epitaxially grown from the buffer layer 520 that is exposed from the reflective layer 540. The n-type nitride layer 550 that is formed of $In_xGa_yAl_zN$ (wherein $0≦x≦1$, $0≦y≦1$, $0≦z≦1$, $x+y+z=1$) may be grown using MOCVD. In this case, a silicon dopant is added to the n-type nitride layer 550 so that the n-type nitride layer 550 may have an n-type conductivity.

The grown n-type nitride layers 550 are combined with each other.

Figure 5C:
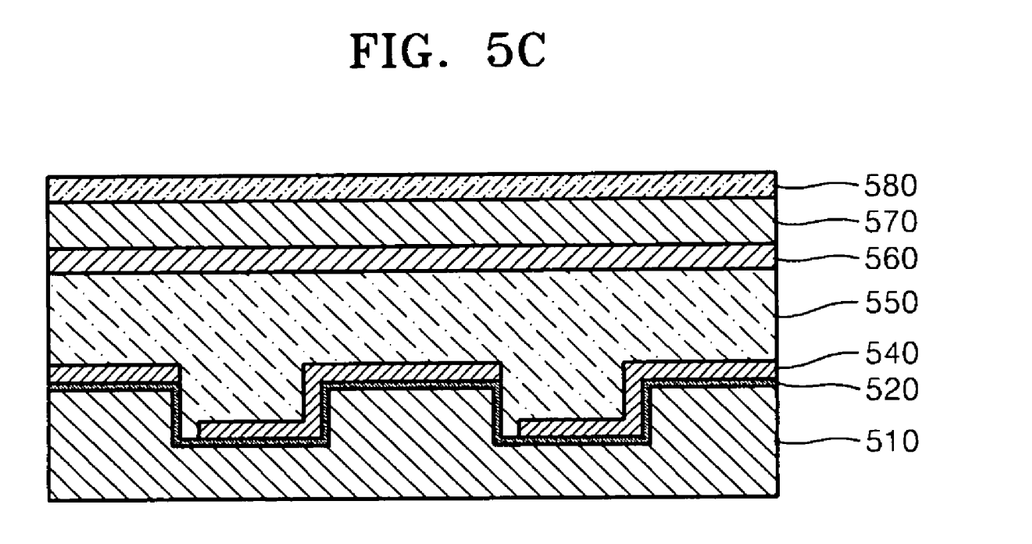

Referring to FIG. 5C, a MQW active layer 560 and a p-type nitride layer 570 are sequentially formed on the n-type nitride layer 550. A transparent electrode layer 580 is formed on the p-type nitride layer 570. The transparent electrode may be formed of at least one of the group consisting of Ni/Au, ITO, ZnO and combinations thereof.

Figure 5D:
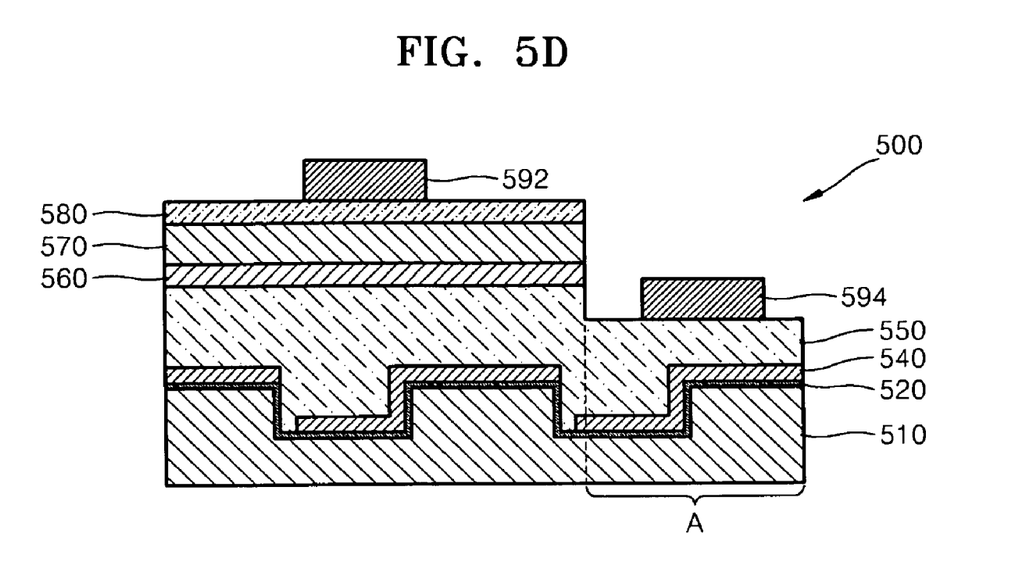

Referring to FIG. 5D, the transparent electrode layer 580, the p-type nitride layer 570, the MQW active layer 560 and the n-type nitride layer 550 are sequentially etched by performing a mesa process in order to expose a portion A of the n-type nitride layer 550. Subsequently, a p-type electrode 592 is formed on the transparent electrode layer 580, and an n-type electrode 594 is formed on the exposed n-type nitride layer 550.

Figure 6:
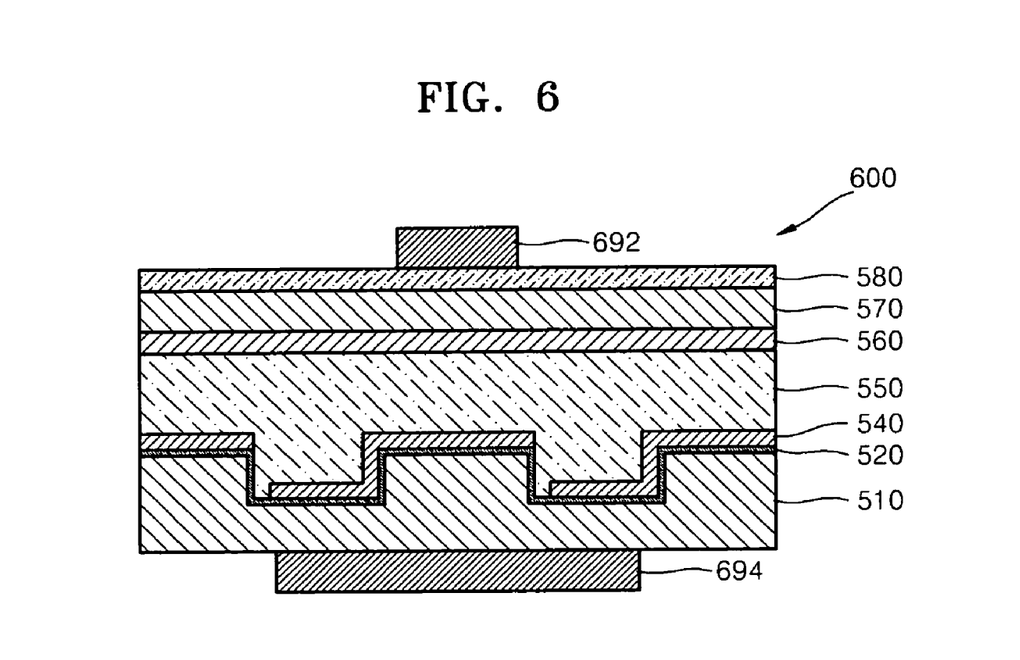
FIG. 6 is a cross-sectional view of a structure of a vertical GaN light emitting device according to example embodiments.

FIG. 6 is a cross-sectional view of a structure of a vertical GaN light emitting device according to example embodiments.

Elements that are substantially the same as those of FIGS. 5A through 5D represent same reference numerals, and thus a detailed description thereof will not be provided here for the sake of brevity.

Referring to FIG. 6, in the vertical GaN light emitting device 600 according to example embodiments, a n-type electrode 694 is formed on a bottom surface of a silicon substrate 510. A buffer layer 520 may be formed to have conductivity by doping a material (e.g., silicon (Si)) into $In_xGa_yAl_zN$ ($0≦x≦1$, $0≦y≦1$, $0≦z≦1$, $x+y+z=1$).

The buffer layer 520 may be formed of a conductive material (e.g., $ZrB_2$, $HfB_2$, ZrN, HfN, TiN, combinations thereof or the like).

An n-type nitride layer 550 may be formed to have n-type conductivity by doping a material (e.g., Si) into the n-type nitride layer 550.

The vertical GaN light emitting device 600 may be manufactured by using the same method as that of FIGS. 5A through 5C. The difference is that the buffer layer 520 and the n-type nitride layer 550 are formed to have conductivity, as described above. Subsequently, a p-type electrode 692 and an n-type electrode 694 are respectively formed on upper and lower surfaces of a resultant structure of FIG. 5C so that the vertical GaN light emitting device 600 may be manufactured.

In a GaN light emitting device and a method of manufacturing a GaN light emitting device according to the above-described example embodiments, only one side surface of a pattern region is exposed by a reflective layer. As such, a significant portion of a silicon substrate is covered by the reflective layer so that optical extraction efficiency may increase.

Furthermore, an n-type nitride layer is horizontally grown so that threading dislocation may be reduced in the pattern region.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A gallium nitride (GaN) light emitting device, comprising:
   a buffer layer on a silicon substrate;
   a first nitride layer on the buffer layer, the first nitride layer including a plurality of patterns, wherein each of the patterns includes a pair of sidewalls that face each other;

a reflective layer on the first nitride layer, wherein one sidewall of the pair is exposed by the reflective layer;

an n-type nitride layer on the reflective layer, wherein the n-type nitride layer covers the exposed sidewall; and a GaN-based light emitting structure layer on the n-type nitride layer.

2. The device of claim 1, wherein the plurality of patterns include a pattern having a shape selected from the group consisting of striped, rectangular, hexagonal and circular.

3. The device of claim 1, wherein the reflective layer has a thickness of about 0.01-μm to about 2-μm.

4. The device of claim 1, wherein the reflective layer includes a plurality of dielectric layers having different refractive indexes and being alternately stacked, or includes a metal layer.

5. The device of claim 1, wherein the buffer layer includes at least one of the group consisting of $In_xGa_yAl_zN$ (wherein $0 \leq x \leq 1$, $0 \leq y \leq 1$, $0 \leq z \leq 1$, $x+y+z=1$), zirconium diboride ($ZrB_2$), hafnium diboride ($HfB_2$), zirconium nitride (ZrN), hafnium nitride (HfN), titanium nitride (TiN), aluminum nitride (AlN) and combinations thereof.

6. The device of claim 1, wherein the GaN-based light emitting structure layer includes:

an active layer, a p-type nitride layer and a transparent electrode layer sequentially stacked on the n-type nitride layer;

a p-type electrode on the transparent electrode layer; and an n-type electrode on a bottom surface of the silicon substrate, wherein the buffer layer and the first nitride layer have a conductivity.

7. The device of claim 1, wherein the GaN-based light emitting structure layer includes:

an active layer, a p-type nitride layer, a transparent electrode layer and a p-type electrode sequentially formed on a first region of the n-type nitride layer; and an n-type electrode on a second region of the n-type nitride layer.

8. A gallium nitride (GaN) light emitting device, comprising:

a silicon substrate having a plurality of patterns, wherein each pattern includes a pair of sidewalls facing each other;

a reflective layer on the silicon substrate, wherein one sidewall of the pair is exposed by the reflective layer;

a buffer layer on the exposed sidewall;

an n-type nitride layer on the reflective layer, wherein the n-type nitride layer covers the exposed side wall; and a GaN-based light emitting structure layer formed on the n-type nitride layer.

9. The device of claim 8, wherein the plurality of patterns include a pattern having a shape selected from the group consisting of striped, rectangular, hexagonal and circular.

10. The device of claim 8, wherein the reflective layer has a thickness of about 0.01-μm to about 2-μm.

11. The device of claim 8, wherein the reflective layer includes a plurality of dielectric layers having different refractive indexes and being alternately stacked, or includes a metal layer.

12. The device of claim 8, wherein the buffer layer includes at least one of the group consisting of $In_xGa_yAl_zN$ (wherein $0 \leq x \leq 1$, $0 \leq y \leq 1$, $0 \leq z \leq 1$, $x+y+z=1$), zirconium diboride ($ZrB_2$), hafnium diboride ($HfB_2$), zirconium nitride (ZrN), hafnium nitride (HfN), titanium nitride (TiN), aluminum nitride (AlN) and combinations thereof.

13. The device of claim 8, wherein the GaN-based light emitting structure layer includes:

an active layer, a p-type nitride layer and a transparent electrode layer sequentially stacked on the n-type nitride layer;

a p-type electrode on the transparent electrode layer; and an n-type electrode on a bottom surface of the silicon substrate, wherein the buffer layer and the first nitride layer have a conductivity.

14. The device of claim 8, wherein the GaN-based light emitting structure layer includes:

an active layer, a p-type nitride layer, a transparent electrode layer and a p-type electrode sequentially formed on a first region of the n-type nitride layer; and an n-type electrode on a second region of the n-type nitride layer.

15. The device of claim 8, wherein the buffer layer is on the silicon substrate, and the reflective layer is on the buffer layer.

16. The device of claim 15, wherein the plurality of patterns include a pattern having a shape selected from the group consisting of striped, rectangular, hexagonal and circular.

17. The device of claim 15, wherein the reflective layer has a thickness of about 0.01-μm to about 2-μm.

18. The device of claim 15, wherein the reflective layer includes a plurality of dielectric layers having different refractive indexes and being alternately stacked, or includes a metal layer.

19. The device of claim 15, wherein the buffer layer includes at least one of the group consisting of $In_xGa_yAl_zN$ (wherein $0 \leq x \leq 1$, $0 \leq y \leq 1$, $0 \leq z \leq 1$, $x+y+z=1$), zirconium diboride ($ZrB_2$), hafnium diboride ($HfB_2$), zirconium nitride (ZrN), hafnium nitride (HfN), titanium nitride (TiN), aluminum nitride (AlN) and combinations thereof.

20. The device of claim 15, wherein the GaN-based light emitting structure layer includes:

an active layer, a p-type nitride layer and a transparent electrode layer sequentially stacked on the n-type nitride layer;

a p-type electrode on the transparent electrode layer; and an n-type electrode on a bottom surface of the silicon substrate, wherein the buffer layer and the first nitride layer have a conductivity.

21. The device of claim 15, wherein the GaN-based light emitting structure layer includes:

an active layer, a p-type nitride layer, a transparent electrode layer and a p-type electrode sequentially formed on a first region of the n-type nitride layer; and an n-type electrode on a second region of the n-type nitride layer.

22. A method of a manufacturing a gallium nitride (GaN) light emitting device, the method comprising:

sequentially forming a buffer layer and a first nitride layer on a silicon substrate;

forming a plurality of patterns by dry etching the first nitride layer, wherein each of the patterns includes a pair of sidewalls that face each other;

depositing a reflective layer on the first nitride layer so that one sidewall of the pair is exposed by the reflective layer;

forming an n-type nitride layer that covers the first nitride layer by horizontally growing an n-type nitride from the exposed sidewall; and forming a GaN-based light emitting structure layer on the n-type nitride layer.

23. The method of claim 22, wherein forming the plurality of patterns includes forming a pattern having a shape selected from the group consisting of striped, rectangular, hexagonal and circular.

24. The method of claim 22, wherein depositing the reflective layer includes irradiating beams formed of a reflective material in a set inclined angle with respect to the first nitride layer by using physical vapor deposition (PVD) having linearity.

25. The method of claim 24, wherein the reflective layer is formed to a thickness of about 0.01-μm to about 2-μm.

26. The method of claim 24, wherein the reflective layer is formed by alternately stacking a plurality of dielectric layers having different refractive indexes, or by forming a metal layer.

27. The method of claim 22, wherein the buffer layer includes at least one of the group consisting of $In_xGa_yAl_zN$ (wherein $0 \leq x \leq 1$, $0 \leq y \leq 1$, $0 \leq z \leq 1$, $x+y+z=1$), zirconium diboride ($ZrB_2$), hafnium diboride ($HfB_2$), zirconium nitride (ZrN), hafnium nitride (HfN), titanium nitride (TiN), aluminum nitride (AlN) and combinations thereof.

28. The method of claim 22, wherein forming the GaN-based light emitting structure layer on the n-type nitride layer includes:
    forming an active layer, a p-type nitride layer and a transparent electrode layer on the n-type nitride layer; and
    forming a p-type electrode on the transparent electrode layer and a n-type electrode on a bottom surface of the silicon substrate,
    wherein the buffer layer and the first nitride layer have a conductivity.

29. The method of claim 22, wherein forming the GaN-based light emitting structure layer on the n-type nitride layer includes:
    forming an active layer, a p-type nitride layer and a transparent electrode layer on the n-type nitride layer;
    sequentially etching the transparent electrode layer, the active layer, the p-type nitride layer and an upper portion of the n-type nitride layer, wherein the transparent electrode layer, the active layer and the p-type nitride layer are formed in a first region of the n-type nitride; and
    forming a p-type electrode on the transparent electrode layer and an n-type electrode on an upper surface of the n-type nitride layer in the first region of the n-type nitride.

30. A method of manufacturing a gallium nitride (GaN) light emitting device, the method comprising:
    forming a plurality of patterns by patterning a silicon substrate, wherein each of the patterns includes a pair of sidewalls that face each other;
    depositing a reflective layer on the silicon substrate so that one sidewall of the pair is exposed by the reflective layer;
    forming a buffer layer on the exposed sidewall;
    forming an n-type nitride layer that covers the silicon substrate by horizontally growing an n-type nitride from the buffer layer; and
    forming a GaN-based light emitting structure layer on the n-type nitride layer.

31. The method of claim 30, wherein forming the plurality of patterns includes forming a pattern having a shape selected from the group consisting of striped, rectangular, hexagonal and circular.

32. The method of claim 30, wherein depositing the reflective layer includes irradiating beams formed of a reflective material in a set inclined angle with respect to the n-type nitride layer by using physical vapor deposition (PVD) having linearity.

33. The method of claim 32, wherein the reflective layer is formed to a thickness of about 0.01-μm to about 2-μm.

34. The method of claim 32, wherein the reflective layer is formed by alternately stacking a plurality of dielectric layers having different refractive indexes, or by forming a metal layer.

35. The method of claim 30, wherein the buffer layer includes at least one of the group consisting of $In_xGa_yAl_zN$ (wherein $0 \leq x \leq 1$, $0 \leq y \leq 1$, $0 \leq z \leq 1$, $x+y+z=1$), zirconium diboride ($ZrB_2$), hafnium diboride ($HfB_2$), zirconium nitride (ZrN), hafnium nitride (HfN), titanium nitride (TiN), aluminum nitride (AlN) and combinations thereof.

36. The method of claim 30, wherein forming the GaN-based light emitting structure layer on the n-type nitride layer includes:
    forming an active layer, a p-type nitride layer and a transparent electrode layer on the n-type nitride layer; and
    forming a p-type electrode on the transparent electrode layer and a n-type electrode on a bottom surface of the silicon substrate,
    wherein the buffer layer and the first nitride layer have a conductivity.

37. The method of claim 30, wherein forming the GaN-based light emitting structure layer on the n-type nitride layer includes:
    forming an active layer, a p-type nitride layer and a transparent electrode layer on the n-type nitride layer;
    sequentially etching the transparent electrode layer, the active layer, the p-type nitride layer and an upper portion of the n-type nitride layer, wherein the transparent electrode layer, the active layer and the p-type nitride layer are formed in a first region of the n-type nitride; and
    forming a p-type electrode on the transparent electrode layer and a n-type electrode on an upper surface of the n-type nitride layer in the first region of the n-type nitride.

38. The method of claim 30, wherein the buffer layer is formed on the plurality of patterns, and the reflective layer is deposited on the buffer layer.

39. The method of claim 38, wherein forming the plurality of patterns includes forming a pattern having a shape selected from the group consisting of striped, rectangular, hexagonal and circular.

40. The method of claim 38, wherein depositing the reflective layer includes irradiating beams formed of a reflective material in a set inclined angle with respect to the buffer layer by using physical vapor deposition (PVD) having linearity.

41. The method of claim 40, wherein the reflective layer is formed to a thickness of about 0.01-μm to about 2-μm.

42. The method of claim 40, wherein the reflective layer is formed by alternately stacking a plurality of dielectric layers having different refractive indexes, or by forming a metal layer.

43. The method of claim 38, wherein the buffer layer includes at least one of the group consisting of $In_xGa_yAl_zN$ (wherein $0 \leq x \leq 1$, $0 \leq y \leq 1$, $0 \leq z \leq 1$, $x+y+z=1$), $ZrB_2$, $HfB_2$, zirconium nitride (ZrN), hafnium nitride (HfN), titanium nitride (TiN), aluminum nitride (AlN) and combinations thereof.

44. The method of claim 38, wherein forming the GaN-based light emitting structure layer includes:
    forming an active layer, a p-type nitride layer and a transparent electrode layer on the n-type nitride layer; and
    forming a p-type electrode on the transparent electrode layer and a n-type electrode on a bottom surface of the silicon substrate,
    wherein the buffer layer and the first nitride layer have a conductivity.

45. The method of claim 38, wherein forming the GaN-based light emitting structure layer includes:

forming an active layer, a p-type nitride layer and a transparent electrode layer on the n-type nitride layer;

sequentially etching the transparent electrode layer, the active layer, the p-type nitride layer and an upper portion of the n-type nitride layer, wherein the transparent electrode layer, the active layer and the p-type nitride layer are formed in a first region of the n-type nitride; and forming a p-type electrode on the transparent electrode layer and an n-type electrode on an upper surface of the n-type nitride layer in the first region of the n-type nitride.

* * * * *